US012791637B2

(12) United States Patent
Finkler et al.

(10) Patent No.: US 12,791,637 B2
(45) Date of Patent: Nov. 10, 2026

(54) RESONATOR FOR NUCLEAR SPIN QUBIT

(71) Applicant: YEDA RESEARCH AND DEVELOPMENT CO. LTD., Rehovot (IL)

(72) Inventors: Amit Finkler, Rehovot (IL); Dan Yudilevich, Rehovot (IL)

(73) Assignee: YEDA RESEARCH AND DEVELOPMENT CO. LTD., Rehovot (IL)

( * ) Notice: Subject to any disclaimer, the term of this patent is extended or adjusted under 35 U.S.C. 154(b) by 191 days.

(21) Appl. No.: 18/931,140

(22) Filed: Oct. 30, 2024

(65) Prior Publication Data

US 2026/0118450 A1 Apr. 30, 2026

(51) Int. Cl.

| | |
|---|---|
| ***G01R 33/12*** | (2006.01) |
| ***G06N 10/20*** | (2022.01) |
| ***G06N 10/40*** | (2022.01) |
| ***H01Q 1/38*** | (2006.01) |

(52) U.S. Cl.

CPC ......... *G01R 33/1284* (2013.01); *G06N 10/20* (2022.01); *G06N 10/40* (2022.01); *H01Q 1/38* (2013.01)

(58) Field of Classification Search

CPC .... G01R 33/1284; G01R 33/26; G06N 10/20; G06N 10/40; H01Q 1/38

See application file for complete search history.

(56) References Cited

FOREIGN PATENT DOCUMENTS

WO WO-2025263209 A1 * 12/2025 ............ H01F 38/14

OTHER PUBLICATIONS

Machine traslation of foreign reference WO-20252632090A1 (Year: 2025).*

Yudilevich et al. “Coherent manipulation of nuclear spins in the strong driving regime” arXiv, Oct. 31, 2023.

Yudilevich et al. “Coherent manipulation of nuclear spins in the strong driving regime” New Journal of Physics. Nov. 24, 2023;25(11):113042.

* cited by examiner

*Primary Examiner* — G.M. A Hyder

(74) *Attorney, Agent, or Firm* — Mark S. Cohen; PEARL COHEN LLP

(57) ABSTRACT

A planar spiral antenna resonator for fast manipulation of nuclear spin for qubit control in quantum computing and similar applications. The antenna exhibits wide bandwidth, and is configured with a central compact optical aperture for quantum sensing when coupled with a crystal lattice containing photo-luminescent defects, such as diamond with nitrogen-vacancy centers. The resonator features strong driving fields, with increased field-to-current ratios for rapid spin flips, exemplified by sub-microsecond proton quantum logic Pauli X-gate.

15 Claims, 5 Drawing Sheets

NOT TO SCALE

RESONATOR FOR NUCLEAR SPIN QUBIT

FIELD

The present invention relates to quantum computing devices and components, specifically to Radio Frequency (RF) resonator excitation of nuclear spin for qubits and quantum logical gates.

BACKGROUND

Quantum sensing with solid-state spin sensors, such as the nitrogen-vacancy (NV) center in diamond, frequently involves manipulating nuclear spin states. Nuclear spins may be part of the sample of interest, as in the case of nanoscale nuclear magnetic resonance (NMR) spectroscopy, which relies on sequences of radio-frequency (RF) pulses applied to the sample to recover information on its chemical structure. Solid-state nuclear spins around the sensor are also utilized as ancilla qubits that store the quantum state of a sensor to retrieve it repeatedly or to prolong the sensing time.

Currently, however, delivering RF pulses relies on antennas that induce weak RF driving fields, with a quantum logic Pauli X-gate lasting a few tens of microseconds. These lengthy pulses imply longer measurement times and, therefore, reduced sensitivity. Inadequate RF driving fields may also impede the application of elaborate pulse sequences, because the sensing time in NV-based NMR is limited by the spin decoherence time of the NV center ($T_2$).

It is therefore desirable to achieve fast manipulation of nuclear spins by strong RF driving fields, to better utilize the limited sensing time of NV center sensors, generate broadband excitation of the nuclear spin resonance, and enable new sensing protocols. This goal is attained by the present invention.

SUMMARY

The present invention provides RF antennas for strong driving fields to rapidly excite and manipulate nuclear spin states for use in quantum computing and other quantum sensing applications. The antennas are based on planar spiral coils, which can be used singly or in dual-spiral configurations. In addition, antenna coils are configured with a compact optical aperture for optically-sensing target states in crystal point defects without diminishing the effectiveness of the antenna. Such a configuration is particularly applicable to exploiting the nitrogen-vacancy defect in the diamond lattice. The present invention enables solid-state quantum computing operations to proceed at room temperature and to accomplish an increased number of operations during the coherence time.

Embodiments of the present invention exhibit strong driving fields, with increased field-to-current ratios for rapid spin flips, and have been demonstrated to support sub-microsecond proton spin flips (π-pulse).

BRIEF DESCRIPTION OF THE DRAWINGS

The subject matter disclosed may best be understood by reference to the following detailed description when read with the accompanying drawings in which.

Figure 1:
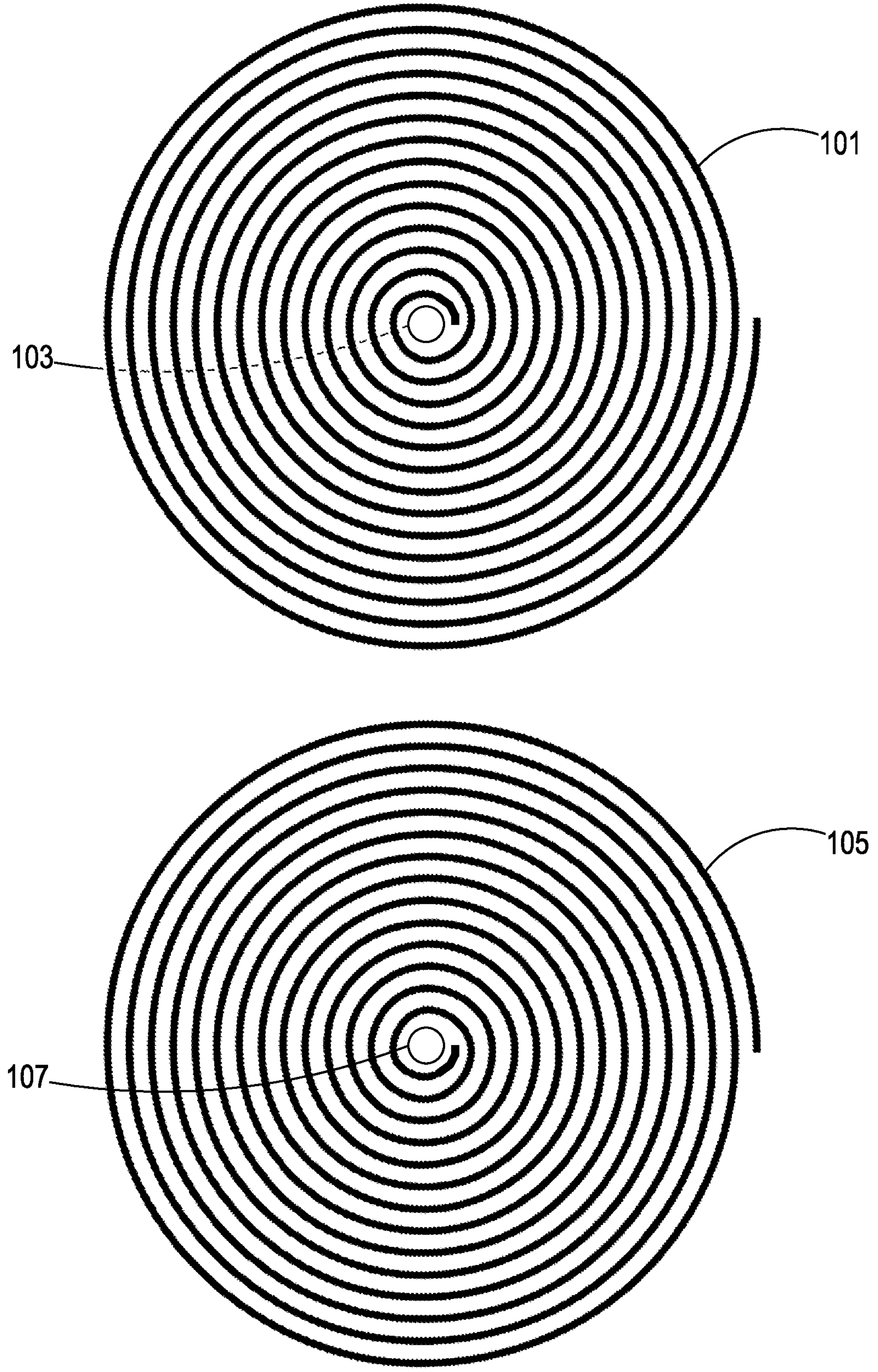
FIG. 1 illustrates spiral RF antenna coils with respective compact optical apertures, according to an embodiment of the present invention.

The drawings are conceptual and schematic. Elements shown in the figures are not drawn to scale. Dimensions, shapes, and proportions of elements are exaggerated relative to other elements, to highlight functional relationships between the elements as components of a system. Reference numerals may be repeated among the figures to indicate corresponding or analogous elements.

DETAILED DESCRIPTION

FIG. 1 illustrates a spiral RF antenna coil 101 having a compact optical aperture 103; and a spiral RF antenna coil 105 having a compact optical aperture 107; both according to an embodiment of the present invention. Coils 101 and 105 are electrically-conductive, with a relatively low DC resistance. In an embodiment of the present invention, a spiral RF antenna coil has a DC resistance of approximately 362; and handles radio frequencies ranging from several hundred kHz to around 10 MHz. In a related embodiment of the present invention, coils 101 and 105 are substantially planar, and can be disposed one above the other in close proximity without touching.

The term "spiral direction" herein denotes how a spiral coil in a particular plane is oriented for current to flow clockwise in the coil. Two coils can have the same or opposite spiral direction. Coil 101 is herein characterized as having an "inward" spiral direction, because as it appears in the plane of FIG. 1, following the coil with the current flowing clockwise, the current goes from its outer perimeter to its center. Coil 105, however, has an opposite spiral direction, "outward", because the current goes from the center to the outer perimeter when the current in coil 105 goes clockwise. The spiral direction depends on how the coil is placed on the plane-flipping the coil over in the plane changes its spiral direction to the opposite spiral direction.

The term "compact optical aperture" herein denotes an aperture in a spiral RF antenna coil to allow passage of light in the visible-infrared region of the spectrum through the antenna coil, for the purpose of optically-sensing spin-dependent photoluminescence, and thereby detecting and measuring quantum spin states excited and manipulated by the RF antenna coil. In an embodiment of the present invention, a compact optical aperture is disposed substantially at the center of the spiral RF antenna coil.

In various embodiments of the present invention, a compact optical aperture has a substantially regular shape. In a related embodiment, a compact optical aperture has substantially a convex regular polygonal shape. In another related embodiment, a compact optical aperture has a substantially circular shape.

In various embodiments, a compact optical aperture has a relatively small area compared to the area occupied by the antenna coil (hence it is considered "compact") such that $A_{aperture} << A_{coil}$, where $A_{aperture}$ is the area of the compact optical aperture, and $A_{coil}$ is the area of the spiral coil. In a related embodiment, $$\frac{A_{aperture}}{A_{coil}} \approx 10^{-3}.$$

The relatively small area of the compact optical aperture compared to that of the coil means that a compact optical aperture causes only a minimal reduction in the intensity of the RF field radiated by the spiral RF antenna coil.

In an embodiment of the present invention, two spiral RF antenna coils are placed geometrically parallel to one another and proximate to one another; and they are electrically-connected in series, as illustrated in the drawings (discussed below). In a related embodiment the two spiral antenna coils are on opposite sides of an electrically-insulating substrate, and the compact optical aperture is a hole in the substrate.

Figure 2:
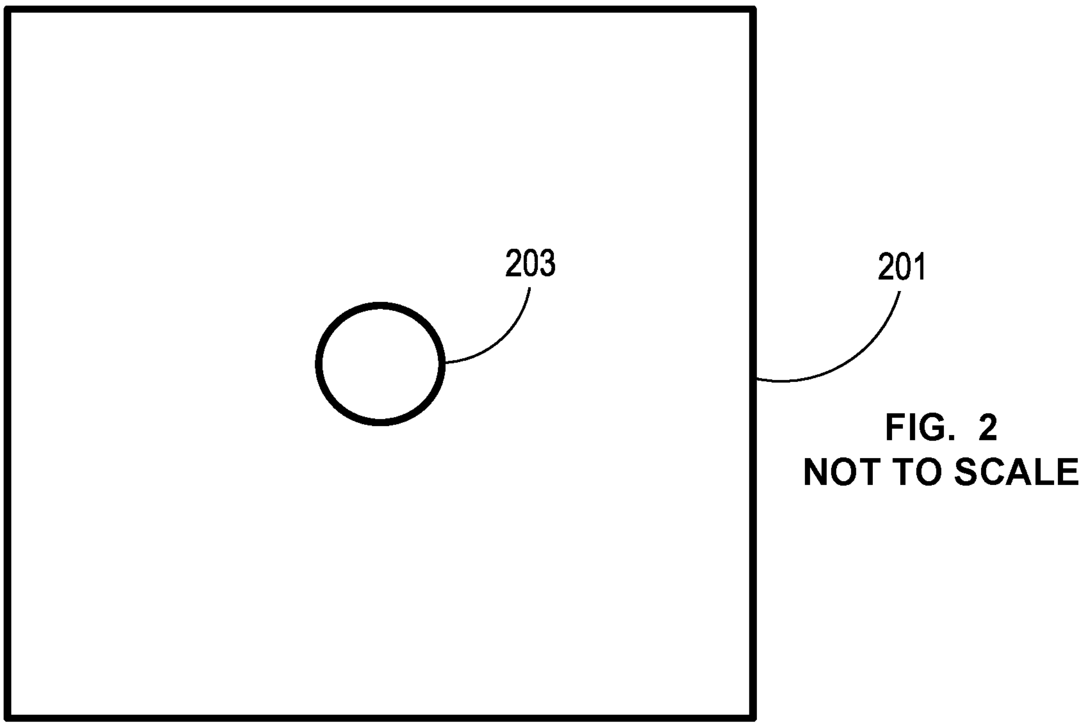
FIG. 2 illustrates an electrically-insulating layer for separating proximate spiral RF antenna coils, according to an embodiment of the present invention.

FIG. 2 illustrates an electrically-insulating layer 201 for separating RF antenna coils 101 and 105, according to an embodiment of the present invention. In a related embodiment of the invention, electrically-insulating layer 201 is perforated by a hole 203 for passage of light in the visible-infrared region of the spectrum, so that when coils 101 and 105 are separated by electrically-insulating layer 201, compact optical apertures 103 and 107 define a passage for light that is not interrupted by electrically-insulating layer 201. In a further embodiment, hole 203 is a compact optical aperture, as described above. In a related embodiment, compact optical aperture 203 has a larger area than compact optical aperture 103 and a larger area than compact optical aperture 107, so that positioning of insulating layer 201 relative to coils 101 and 105 is not critical.

In an embodiment of the present invention, electrically-insulating layer 201 is a polyimide substrate, and in a related embodiment the polyimide substrate has a thickness of approximately 20 μm.

Figure 3:
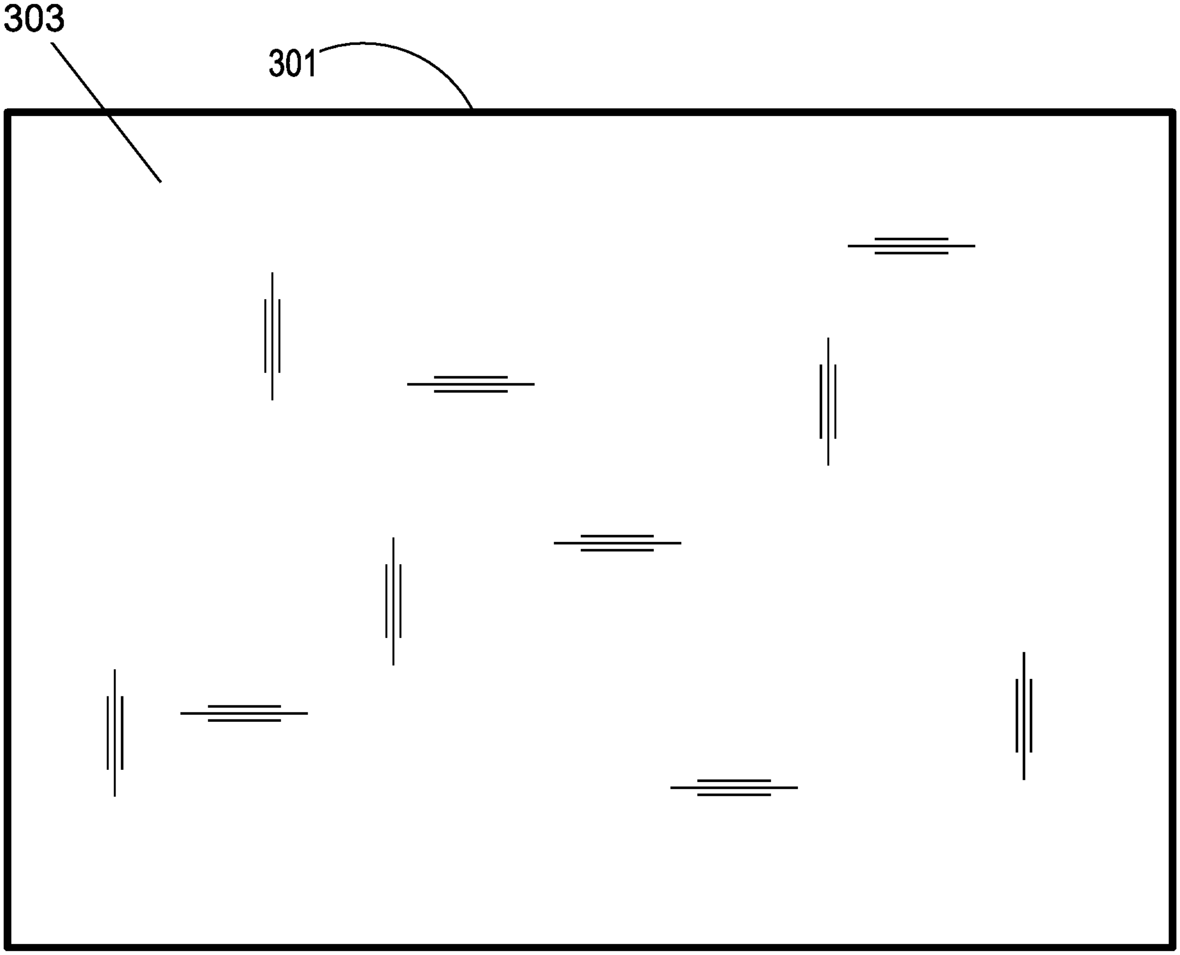
FIG. 3 illustrates a surface of a crystal having solid-state lattice defects.

FIG. 3 illustrates a surface of a crystal 301 having solid-state lattice defects 303 which serve as quantum sensors. In an embodiment of the present invention, crystal 301 is a diamond, and lattice defects 303 are nitrogen-vacancy (NV) centers, whose axes project onto the surface of (diamond) crystal 301 as graphically suggested. Lattice defects 303 are physically of atomic dimension and are not directly visible—the graphical depictions of defects 303 are schematic and are conceptual representations only, to indicate the presence of lattice defects in crystal 301.

Figure 4:
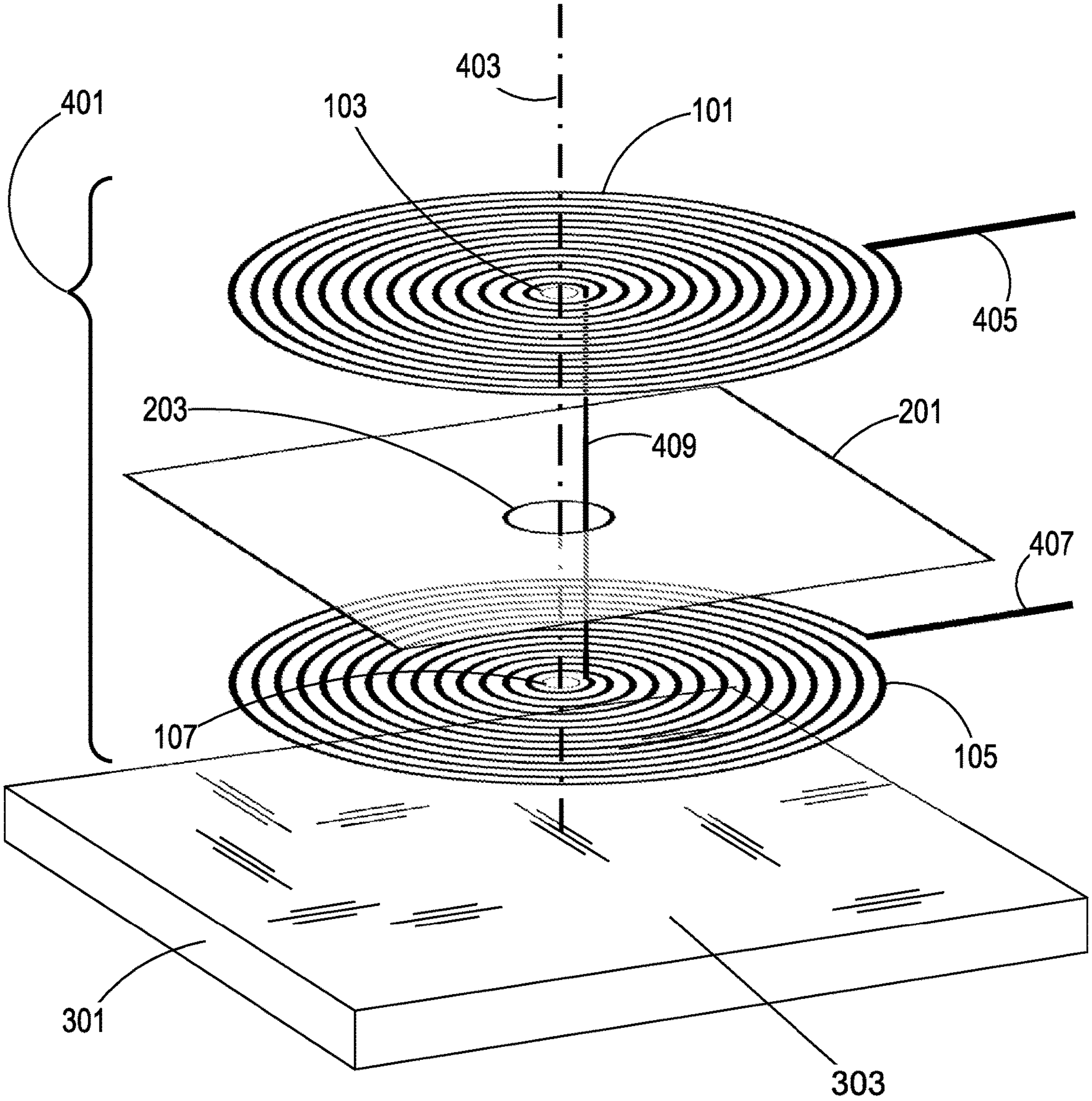
FIG. 4 illustrates an exploded view of a dual spiral RF antenna with coaxial compact optical apertures, as mounted over a surface of a crystal having solid-state lattice defects, according to an embodiment of the present invention.

FIG. 4 illustrates a dual spiral RF antenna 401 in an exploded view along an axis 403 which is perpendicular to a surface of crystal 301, according to an embodiment of the present invention. In this embodiment, from the top of the exploded view downward, RF antenna 401 includes:

spiral RF antenna coil 101;
electrically-insulating layer 201; and
spiral RF antenna coil 105.

Antenna coils 101 and 105 are aligned on axis 403 so that compact optical aperture 103 is co-axial with compact optical aperture 107. In addition, hole 203 of electrically-insulating layer 201 is also aligned on axis 403 so that compact optical apertures 103 and 107 and hole 203 are all coaxial, with compact optical apertures 103 and 107 having substantially the same regular shape, so that an optical path exists at the center of RF antenna 401; That is, RF antenna 401 has a central compact optical aperture 103-203-107 for light in the visible-infrared region, with compact optical aperture 103-203-107 having substantially the same regular shape as compact optical apertures 103 and 107.

Electrical connections for RF antenna 401 in this embodiment are also shown in FIG. 4. A top feed 405 connects to an outer loop of spiral RF antenna coil 101; and a bottom feed 407 connects to an outer loop of spiral RF antenna coil 105. The circuit is completed by an electrical connection 409 from an inner loop of spiral RF antenna coil 101 to an inner loop of spiral RF antenna coil 105. Electrical connection 409 is shown as extending over a long distance along axis 403 in the exploded view, but the illustration shows this only to indicate that there is an electrical connection between the inner loop of spiral RF antenna coil 101 and the inner loop of spiral RF antenna coil 105. In actuality, RF antenna coil 101 is proximate to spiral RF antenna coil 105, and electrical connection 409 is very short, as described below with reference to FIG. 5 and FIG. 6.

It is important to detail how the completed circuit described above operates as an RF antenna. First, note that spiral RF antenna coil 101 has an inward spiral direction, as previously described. In accordance with the definition of spiral direction given above, this means that as current flows inward through spiral RF antenna coil 101 from top feed 405 to electrical connection 409 the current flows clockwise in spiral RF antenna coil 101. Next, note that spiral RF antenna coil 105 has an outward spiral direction, as also previously described. Thus, as current flows outward through RF antenna coil 105 from electrical connection 409 to bottom feed 407 the current also flows clockwise in spiral RF antenna coil 105. Therefore, as current flows from top feed 405 to bottom feed 407, current flows clockwise through both RF antenna coil 101 and RF antenna coil 105. Similarly, as current flows in the reverse direction, i.e., from bottom feed 407 to top feed 405, current flows counter-clockwise through both RF antenna coil 101 and RF antenna coil 105. In other words, the rotation of current flow has the same phase in both RF antenna coil 101 and RF antenna coil 105.

In the above-described embodiment of the invention, spiral RF antenna coil 101 and spiral RF antenna coil 105 are shown having opposite spiral direction. In an alternative embodiment, spiral RF antenna coil 101 and spiral RF antenna coil 105 instead have the same spiral direction.

Figure 5:
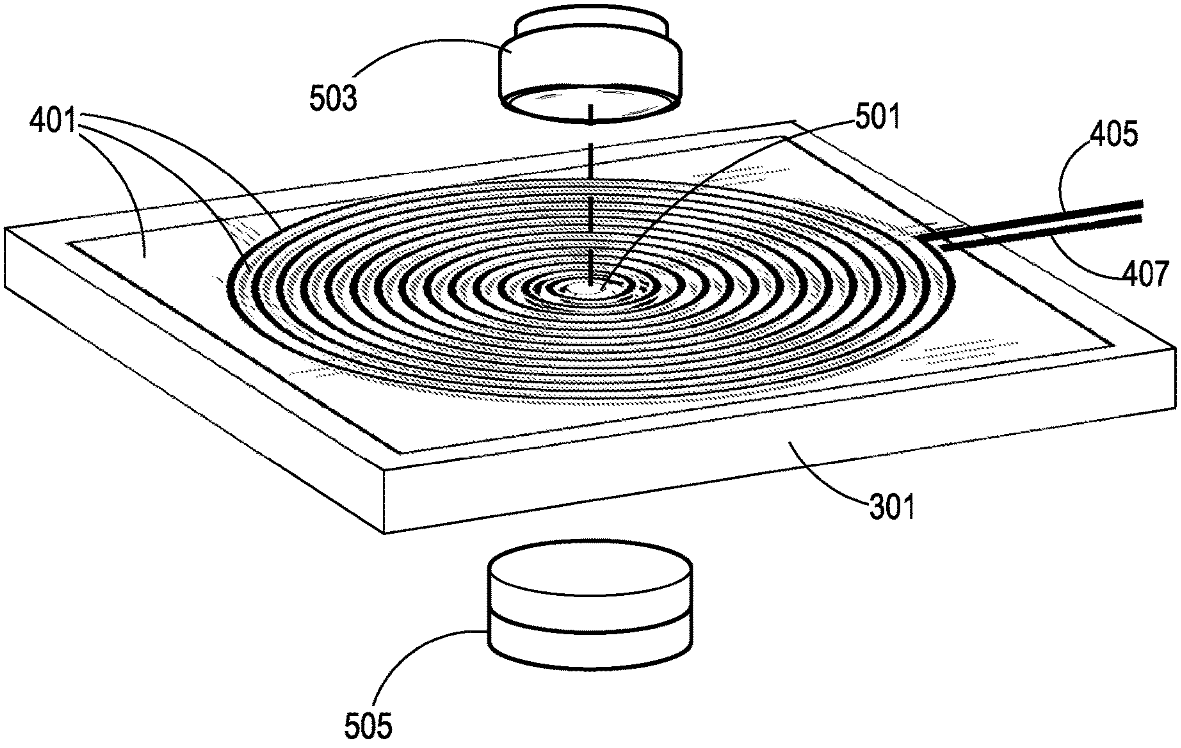
FIG. 5 illustrates a dual spiral RF antenna having a compact optical aperture, with an objective lens oriented for optical access of the crystal lattice defects, and a magnet to establish a background magnetic field.

FIG. 5 illustrates dual spiral RF antenna 401 having a compact optical aperture 501. Here, compact optical aperture 501 is the same as compact optical aperture 103-203-107 shown in component form in the exploded view of FIG. 4, but seen in FIG. 5 in a non-exploded view.

Shown schematically in FIG. 5 are also an objective lens 503, to enable optical sensing of quantum spin states; and a magnet 505 to establish a background magnetic field.

Figure 6:
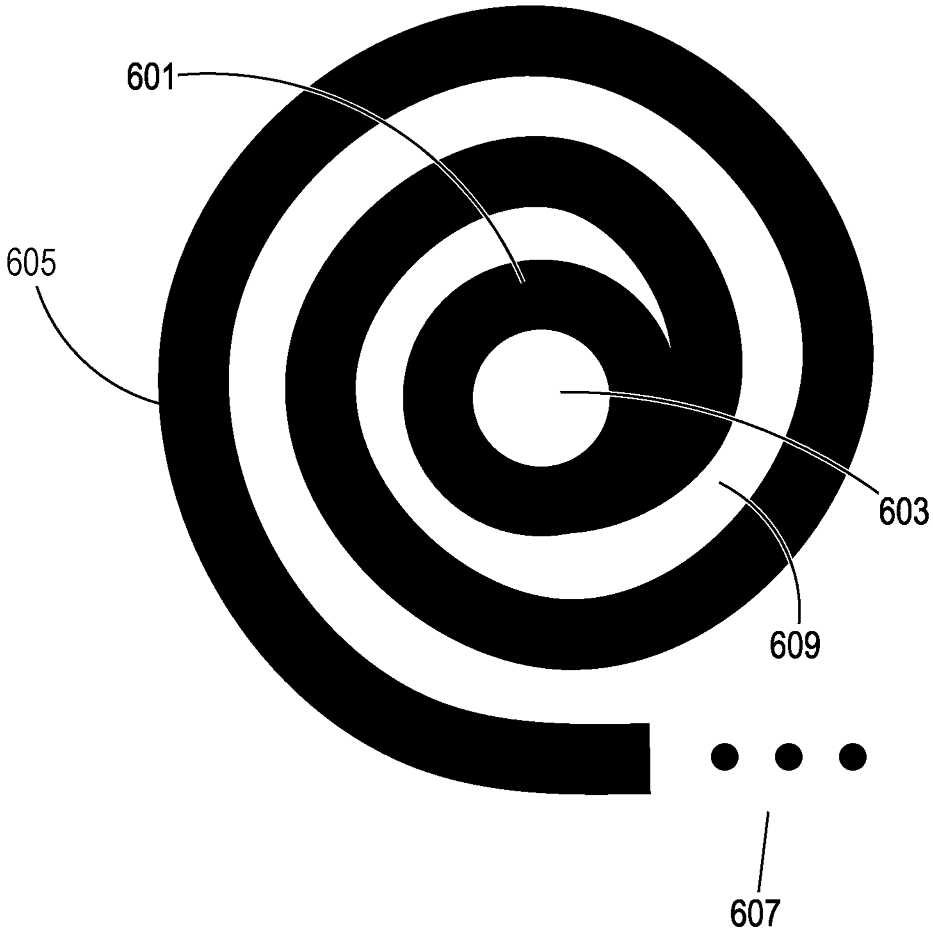
FIG. 6 illustrates an electrically-conductive via surrounding a compact optical aperture in a substrate having a spiral RF antenna coil.

FIG. 6 illustrates an electrically-conductive via 601 surrounding a compact optical aperture 603 in a substrate (not shown) having a spiral RF antenna coil 605 (only a portion shown—the rest of the coil is indicated by an ellipsis 607). Also illustrated is a non-conductive region 609 acting as an inter-turn electrically-insulating spacer for conductive coil 605. In cases where dual spiral coils are fabricated on opposite sides of a substrate, electrically-connecting their inner turns is readily done with a via, such as electrically-conductive via 601, and it is easy to fabricate such a via surrounding compact optical aperture 603.

Some representative order-of-magnitude physical dimensions for embodiments of the present invention include:

Spiral RF antenna coil outer loop diameter, in the order of 6 mm;

Spiral RF antenna coil number of turns, in the order of 14-15;

Spiral RF antenna coil inner loop diameter, in the order of 600 μm;

Spiral RF antenna coil trace width, in the order of 100 μm;

Spiral RF antenna coil trace spacing, in the order of 80 μm;

Compact optical aperture diameter, in the order of 200 μm; and

Electrically-insulating layer between coils, in the order of 20 μm.

The aperture-coil area ratio $$\frac{A_{aperture}}{A_{coil}} \cong \left(\frac{200 * 10^{-6}}{6 * 10^{-3}}\right)^2 \cong 10^{-3}.$$

The above order-of-magnitude physical dimensions are for reference and informational purposes only.

Fabrication of devices disclosed herein can be accomplished using existing integrated circuit fabrication technology. No special fabrication techniques are needed to carry out the invention as disclosed herein.

What is claimed is:

1. A Radio Frequency (RF) resonator for manipulating nuclear spin during quantum computing, the resonator comprising:

a first substantially planar electrically-conductive spiral coil for radiating an RF field; and a first compact optical aperture disposed in the center of the first electrically-conductive spiral coil, wherein the first compact optical aperture allows passage of light in the visible-infrared range.

2. The RF resonator of claim 1, the resonator further comprising:

a second substantially planar electrically-conductive spiral coil for radiating the RF field;

a second compact optical aperture disposed in the center of the second electrically-conductive spiral coil, wherein the second compact optical aperture allows passage of light in the visible-infrared range; and an electrically-conductive serial connection between the first electrically-conductive spiral coil and the second electrically-conductive spiral coil;

wherein:

the first compact optical aperture and the second compact optical aperture are coaxial and both have a substantially identical regular shape, such that the first compact optical aperture and the second compact optical aperture in combination allow passage of light in the visible-infrared range.

3. The RF resonator of claim 2, further comprising an electrically-insulating substrate between the first electrically-conductive spiral coil and the second electrically-conductive spiral coil, wherein:

a third compact optical aperture is disposed in the electrically-insulating substrate, such that the third compact optical aperture and the first compact optical aperture are coaxial; and the electrically-conductive serial connection between the first electrically-conductive spiral coil and the second electrically-conductive spiral coil is an electrically-conductive via within the electrically-insulating substrate.

4. The RF resonator of claim 3, wherein the electrically-conductive via substantially surrounds the third compact optical aperture.

5. The RF resonator of claim 2, wherein the first planar electrically-conductive spiral coil and the second planar electrically-conductive spiral coil have opposite spiral direction.

6. The RF resonator of claim 2, wherein the first planar electrically-conductive spiral coil and the second planar electrically-conductive spiral coil have the same spiral direction.

7. The RF resonator of claim 2, wherein the resonator further comprises an electrically-insulating layer disposed between the first electrically-conductive spiral coil and the second electrically-conductive spiral coil;

and wherein:

the electrically-insulating layer allows passage of light in the visible-infrared range between the first compact optical aperture and the second compact optical aperture.

8. The RF resonator of claim 5, wherein the electrically-insulating layer is perforated by a hole between the first compact optical aperture and the second compact optical aperture.

9. The RF resonator of claim 2, further comprising an objective lens for refracting light in the visible-infrared range passed by the first compact optical aperture.

10. The RF resonator of claim 2, further comprising a crystal having a spin-dependent photoluminescent solid-state lattice defect, wherein the crystal is located within the RF field.

11. The RF resonator of claim 10, further comprising a magnet for establishing a magnetic field in the region of the crystal.

12. The RF resonator of claim 10, wherein the crystal is diamond, and the spin-dependent photoluminescent solid-state lattice defect is a nitrogen-vacancy (NV) defect.

13. The RF resonator of claim 11, wherein the resonator manipulates a solid-state nuclear spin as a qubit.

14. The RF resonator of claim 13, wherein the qubit is an ancilla qubit.

15. The RF resonator of claim 13, wherein the qubit is a quantum memory qubit.

* * * * *